United States Patent [19]

Baur

[11] Patent Number: 4,864,247
[45] Date of Patent: Sep. 5, 1989

[54] HIGH SPEED BASE DRIVE FOR POWER AMPLIFIER

[76] Inventor: Bruce K. Baur, 14288 SE. Johnson Rd., Milwaukie, Oreg. 97222

[21] Appl. No.: 270,716

[22] Filed: Nov. 14, 1988

[51] Int. Cl.$^4$ .......................... H03F 3/04; H01J 29/70
[52] U.S. Cl. .................................... 330/251; 315/403; 307/300
[58] Field of Search .......................... 330/207 A, 251; 307/300; 315/403

[56] References Cited

U.S. PATENT DOCUMENTS

| | | |
|---|---|---|
| 3,253,160 | 5/1966 | Hall et al. .......................... 307/300 X |
| 4,612,451 | 9/1986 | Maekawa et al. ............... 307/300 X |

Primary Examiner—James B. Mullins
Attorney, Agent, or Firm—William K. Bucher

[57] ABSTRACT

A base drive circuit for a flyback output transistor has an inductive element having series connected coils for generating a linear ramping current to the base electrode of the output transistor in response to an input pulse. A high, almost instantaneous reverse current is produced through a discharge coil that receives inductively coupled energy from the current generating coils. The ratio of the maximum input current to the discharge current is established by the number of coils generating the input current versus the number of coils in the discharge circuit. Linearity of the base drive current is maintained by dissipating any excess energy in the inductive element to ground prior to each input pulse.

7 Claims, 1 Drawing Sheet

HIGH SPEED BASE DRIVE FOR POWER AMPLIFIER

A BACKGROUND OF THE INVENTION

The present invention relates to power amplifiers and, in particular, to a base drive circuit for increasing the speed and efficiency of a flyback output transistor.

Power amplifiers designed to function as flyback output circuits typically operate as high current switching devices that drive inductive loads, such as a yoke mechanism of a horizontal deflection circuit of a display system employing a cathode ray tube. Such an amplifier is described in U.S. Pat. No. 4,670,692 by Meigs and assigned to Tektronix, Inc. Meigs describes a high speed power amplifier for driving inductive loads at frequencies of at least 270 khz. A continuous square-wave signal having a 50% duty cycle is applied to the base of an output flyback transistor through an inductor and a resistor. On the first positive cycle of the square-wave signal, current flows through the inductor and the resistor and into the base of the output transistor. On the downward cycle of the square-wave signal, a shunt diode, in parallel with the inductor and the resistor, is biased into conduction to remove an induced storage charge in the base of the output transistor.

A significant drawback to this type of base drive is that the stored flux in the inductor is not totally dissipated during the removal of the induced storage charge on the base of the transistor. This causes the current flowing into the base of the transistor to step-up sharply at the start of the next positive cycle of the square-wave signal. The current flowing into the base gradually increases from the initial sharp step until the next downward cycle of the square-wave signal. The initial sharp increase in the base drive current decreases the efficiency of the output transistor and induces excess storage charge.

An additional drawback to the Meigs' design is the time required to remove the induced storage charge in the base of the output transistor. Approximately one microsecond elapses between the start of the reverse current and the time the current reaches a maximum. This response time limits the operating speed of the output transistor.

What is needed is a base drive circuit that linearly increases the base drive current to an output transistor from an initial zero value. In addition, to increase the speed of the output transistor the reverse base current needs to be very high and turn on very rapidly.

SUMMARY OF THE INVENTION

In accordance with the present invention a base drive circuit for a power amplifier has a current generating device responsive to an input pulse that generates a linear ramping current at the base electrode of an output transistor. The base drive current induces a storage charge in the base of the output transistor that is removed by a high, almost instantaneous current pulse through a discharge circuit when the input pulse is removed. Any excess energy is removed from the current generating device and the discharging circuit prior to the next conductive cycle of the current generating device.

In the preferred embodiment, the base drive current to the output transistor ramps-up in a manner similar to its collector current to achieve better saturation of the output transistor with less induced storage charge on the base electrode. This produces a better rive match which increases the efficiency of the power amplifier. In addition, the switching speed of the transistor is increased by having less induced storage charge on the base of the transistor. Further, the current generating device and the discharge circuit are a part of an inductive element having series connected coils that are twisted with respect to each other and wrapped around a inconductive core. A portion of the coils in the inductive element act in series to generate the base drive current while another portion acts as a transformer by inductively receiving energy from the current generating coils to discharge the induced stored charge on the base of the output transistor. The transformer action of the inductive element substantially decreases the time required to remove the induced stored charge in the base electrode of the output transistor which increases the speed of the device.

The objects, advantages and novel features of the present invention are apparent from the following detailed description when read in conjunction with the appended claims and attached drawings.

DESCRIPTION OF THE PREFERRED EMBODIMENT

Figure 1:
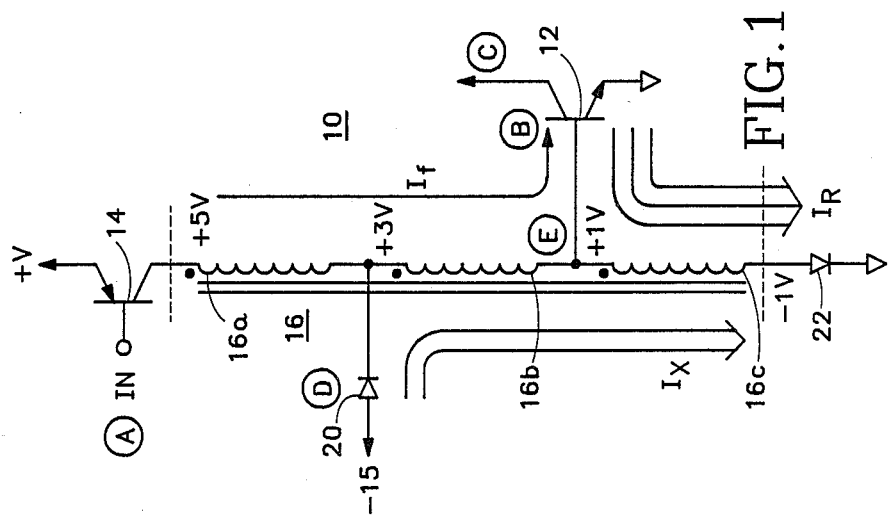
FIG. 1 is a schematic diagram of the base drive circuit of the present invention.

Referring to FIG. 1, there is shown a base drive circuit 10 for a power transistor 12 according to the present invention. The base drive circuit drives the power transistor used as an output transistor in a flyback output circuit. Transistor 14, used as a base drive switch, is coupled via its collector to a inductive element 16 having series connected coils a, 16b, and 16c that are inductively coupled to to each other to produce low leakage inductance between the coils for transferring stored flux between the coils. Coils 16a, 16b, and 16c may be twisted with respect to each other and wrapped around a core material, represented by parallel lines 18, of compressed iron powder or the like. This produces tighter inductive coupling or low leakage inductance between coils 16a, 16b, and 16c, permitting better high frequency transfer of energy between coils, than merely wrapping the coils individually around the core material. Coupled to the junction of coils 16a and 16b is the cathode of diode 20. The anode of diode 20 is coupled to a voltage source, such as −15 volts. The junction of coils 16b and 16c is coupled to the base electrode of power transistor 12. The emitter of the power transistor is coupled to ground while the collector is coupled to an inductive load (not shown), such as the horizontal deflection coils of a cathode ray tube type display device. Coupled to the opposite end of coil 16c is the anode of diode 22 which has its cathode coupled to ground.

Figure 2:
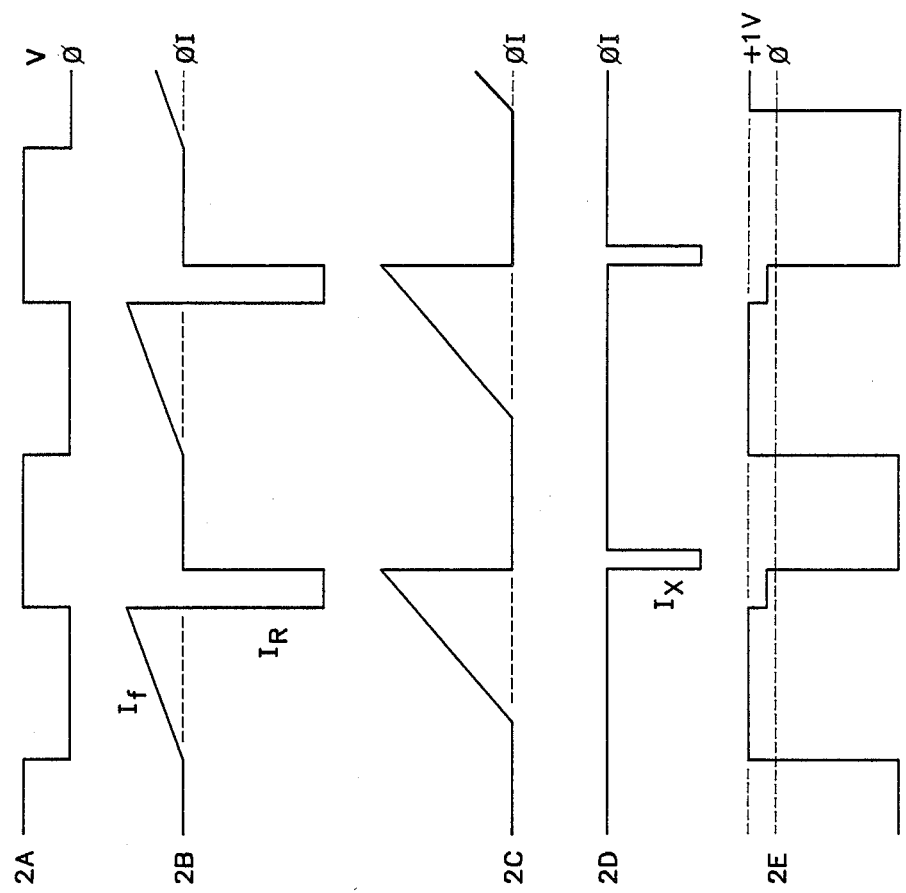
FIGS. 2A-2E are representative waveforms at various locations on the schematic diagram of FIG. 1.

The waveforms shown in FIGS. 2A-2E, illustrate the operation of the base drive circuit. An input pulse, shown in FIG. 2A as a square wave having a frequency of 126 Khz and an approximate 50% duty cycle, is applied to the base electrode of base drive switch transistor 14 causing the transistor to conduct during the negative cycle and placing a voltage, such as +5 volts, on the collector output. The voltage level on the collector of base drive switch transistor 14 may be varied to change the drive to the output transistor. For example, to drive the output transistor deeper into saturation, increasing the voltage level on the emitter of transistor 14 increases the collector voltage and consequently the current through the inductive element 16 into the base electrode of transistor 12. The voltage on the collector of transistor 14 is coupled to the inductive element 16 which develops approximately the same voltage drop across each of the coils 16a, 16b, and 16c as shown in FIG. 1. The inductive coupling between the coils in element 16 induces a voltage across coil 16c which places a $-1$ v on the anode of diode 22, effectively disconnecting diode 22 and coil 16c from the base of transistor 12. A linear ramping current, shown in FIGS. 1 and 2B as $I_F$, is developed through coils 16a and 16b and coupled into the base electrode of transistor 12. This base current drives transistor 12 into conduction producing current flow in its collector, as shown in FIG. 2C. A comparison of FIGS. 2B and 2C shows the base current ramping-up in a manner similar to the current in the collector of transistor 12. The ramping-up of the base current as the collector current ramps up achieves better saturation of the output transistor with less induced storage charge producing a better drive match which increases the efficiency of the flyback output circuit.

When the input pulse to transistor 14 is removed, the transistor is shut off and the voltage on its collector goes to zero effectively opening the 16a and 16b coil circuit. The magnetic flux built-up causes the voltages on the coils to reverse, driving the voltage at the junction of the inductive element 16 and transistor 14 negative. With the voltages reversed on the coils, diode 22 is biased into conduction effectively connecting coil 16c to the base electrode of transistor 12. A high, almost instantaneous negative current pulse, shown as $I_R$ in FIGS. 1 and 2B, flows out of the base electrode of transistor 12 to remove the built-up storage charge on the base. The maximum amount of current flowing out of the base electrode through discharge coil 16c is equal to twice the maximum amount of current flowing into the base electrode. This ratio is set by the number of coils in the inductive element 16 coupled to supply current to the base electrode versus the number of coils coupled to remove the storage charge from the base electrode. As was previously described, coils 16a and 16b are effectively disconnected from the base electrode of transistor 12 when the voltage is removed from the inductive element 16. Coils 16a and 16b, not having an effective current path, couple their stored flux to coil 16c. Since the voltage across coil 16c is lower than the voltage on coils 16a and 16b, the inductively coupled current is effectively doubled causing twice the current flow out of the base of transistor 12. The inductive element 16 is effectively acting as a transformer during this time. As can be appreciated, changing the number of coils supplying current to the base electrode changes the amount of current flowing out of the base electrode. For example, including an additional coil in the ramping input current portion of the inductive element 16 produces three times the maximum discharge current during the removal of the storage charge from the base electrode. The determination as to the number of coils to be used in the inductive element and the ratio of the ramping current in versus the discharge current out of the base electrode is dependent on the characteristics of the output transistor 12.

Since inductors resist changes in current flow, the current flowing out of the base electrode of transistor 12 reaches its maximum value very rapidly, on the order of 50 nanoseconds in the preferred embodiment, and continues to flow until the induced storage charge on the base electrode is removed. The storage charge on the base electrode acts like a huge capacitor which in conjunction with the inductance of coil 16c maintains the maximum current flow out of the base electrode until the stored charge is removed. With the induced storage charge removed, the capacitive effect disappears and the base current returns to a zero value, cutting off transistor 12 and causing the collector current to drop to zero.

The amount of energy removed from the base electrode in the form of the discharging current pulse is equal to the energy supplied to the base electrode in the form of the ramping base current used for basic transistor operation and any excess induced storage charge. This is representatively shown in FIG. 2B as the area under the ramping input current and the area within the negative current pulse. Based on the operating characteristics of the output transistor 12, the base drive circuit 10 is adjustable to maximize the speed and efficiency of the output transistor. For example, the amount of energy in the form of current to drive the output transistor 12 can be adjusted by varying the voltage on the current generating device 16. Likewise, increasing the winding ratio of the inductive element 16, increases the amplitude of the negative current pulse which increases the speed at which the induced storage charge is removed, thus decreasing the pulse width of the current pulse. A smaller pulse width allows increased switching speeds for the output transistor.

With reference to FIG. 2E, the voltage on the base of transistor 12 has a value of approximately 1 volt during the time current is flowing into the base. This is caused by the voltage drops across the internal base diode and resistive drops in output transistor 12. During the time the current is flowing out of the base electrode of transistor 12, the voltage on the base is approximately zero. With the storage charge removed and no current flowing out the base electrode of transistor 12, the voltage on coil 16c continues to reverse, driving the voltage on the base negative. The voltage on the junction of coils 16a and 16b decreases at twice the rate of the base electrode junction due to the inductive coupling effect of the coils. The voltage on the junction of coils 16a and 16b decreases to a value where diode 20 becomes forward biased and conducts. With diode 20 conducting, coils 16b and 16c effectively act as a voltage divider network between the $-15$ volt supply and ground. This clamps the voltage on the base electrode of transistor 12 at approximately $-7.5$ volts and prevents catastrophic reverse biasing of the base-emitter junction of the power amplifier 12. At the same time, the excess flux in the coils of the inductive element 16 is dissipated into the $-15$ volt supply through ground, shown as $I_X$ in FIG. 1 and by the waveform diagram of FIG. 2D for current flowing through diode 20. With the excess flux removed from the inductive element 16, the voltage at all points along the inductive element 16 are floating and no current is flowing. The removal of the excess flux in coils 16a, 16b, and 16c prior to the next conductive cycle of the inductive element 16 insures a linear ramping current is coupled to the base electrode of transistor 12 starting from zero.

A base drive circuit 10 for a power transistor 12 used in a flyback output circuit has been described where an inductive element 16 has series connected coils developing a linear ramping current into the base electrode of the power transistor when a voltage is applied to the inductive element 16. A high, almost instantaneous reverse base current is generated through a discharge coil in the inductive element to remove an induced storage charge on the base when the voltage is removed from device 16. The ratio of the number of coils coupled to supply current to the base electrode versus the number of coils coupled to remove the stored charge on the base electrode determines the maximum reverse current flowing out of the base. Any excess energy in the inductive element 16 is dissipated to a voltage supply through ground prior to the next conductive cycle of element 16. This insures a linear ramping current to the base drive electrode of the output transistor that starts from zero. These and other aspects of the present invention are set forth in the appended claims.

I claim:

1. A base drive circuit for a power amplifier comprising:
   means responsive to an input pulse for generating a linear ramping current on the base of a power transistor for the duration of said input pulse;
   means coupled to said base for rapidly discharging an induced storage charge in said power transistor when said input pulse is removed from said current generating means; and
   means coupled to said base electrode for maintaining linearity of said linear ramping current.

2. The base drive circuit for a power amplifier comprising:
   an inductive element coupled to receive an input pulse at one end to generate a linear ramping current on the base of a power transistor, the base being coupled to a first tap on said inductive element
   a first reference potential coupled to the other end of said inductive element providing a current path to discharge an induced storage charge in said power transistor when said input pulse is removed; and
   a second reference potential coupled to a second tap on said inductive element to dissipate residual energy in said inductive element after said induced storage charge is removed, the second tap being situated between the first tap and the one end of the inductive element.

3. The base drive circuit of claim 2 wherein said inductive element comprises a plurality of coils connected in series and inductively coupled together, said series connected coils coupled to receive said input pulse at one end and said first reference potential at the other and having first and second junctions between said coils corresponding to said first and second taps respectively coupled to the base of said power transistor and to said second reference potential.

4. The base drive circuit of claim 3 wherein at least two of the series connected coils are coupled between said input pulse and the base to generate a linear ramping current on the base of said power transistor.

5. The base drive circuit of claim 3 wherein at least one of said series connected coils is coupled between said first reference potential and the base to discharge an induced storage charge in said power transistor when said input pulse is removed.

6. The base drive circuit of claim 3 wherein at least two of said series connected coils are connected between said second reference potential and said first reference potential to dissipate residual energy in said coils after said induced storage charge is removed, the junction between the two coils being the first junction.

7. A base drive circuit for a power amplifier comprising:
   at least three coils connected in series and inductively coupled together, a first junction between a first pair of coils being coupled to the base of a power transistor;
   means for applying an input pulse to one end of the series connected coils to generate a linear ramping current on the base of the power transistor;
   a first diode connected between the other end of the series connected coils and a first reference potential, the first diode providing a current path to discharge an induced storage charge in said power transistor when said input pulse is removed; and
   a second diode coupled between a second reference potential and a second junction between a second pair of coils, the second junction being located between the first junction and the applying means, to dissipate residual energy in the coils after said induced storage charge is discharged.

* * * * *